US006209055B1

(12) United States Patent
Durham et al.

(10) Patent No.: US 6,209,055 B1
(45) Date of Patent: Mar. 27, 2001

(54) METHOD AND APPARATUS FOR REDUCING NOISE INDUCED AMONG CONDUCTIVE LINES

(75) Inventors: Christopher McCall Durham; Peter Juergen Klim; John Andrew Beck, all of Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/182,301

(22) Filed: Oct. 29, 1998

(51) Int. Cl.$^7$ .............. G06F 13/00; G06F 3/00; G11C 7/02; G11C 5/06
(52) U.S. Cl. .............. 710/131; 710/1; 365/51; 365/63; 365/106; 365/206
(58) Field of Search ............. 710/1, 131; 365/63, 365/106, 206, 51

(56) References Cited

U.S. PATENT DOCUMENTS

| 4,602,355 | * | 7/1986 | Watanabe | 365/206 |
|---|---|---|---|---|
| 4,757,218 | * | 7/1988 | Nawaki | 327/310 |
| 4,858,017 | | 8/1989 | Torbey | 358/426 |
| 4,922,459 | * | 5/1990 | Hidaka | 365/206 |
| 4,962,327 | * | 10/1990 | Iwazaki | 326/106 |
| 5,142,167 | | 8/1992 | Temple et al. | 326/26 |
| 5,243,547 | | 9/1993 | Tsai et al. | 703/14 |
| 5,280,453 | * | 1/1994 | Miyawaki et al. | 365/206 |
| 5,475,643 | * | 12/1995 | Ohta | 365/206 |
| 5,550,769 | * | 8/1996 | Hidaka et al. | 365/63 |
| 5,572,736 | | 11/1996 | Curran | 713/320 |
| 5,574,921 | | 11/1996 | Curran | 713/320 |
| 5,625,234 | * | 4/1997 | Suzuki et al. | 257/773 |
| 6,034,879 | * | 3/2000 | Min et al. | 365/63 |
| 6,111,773 | * | 8/2000 | Pinney | 365/51 |
| 6,111,774 | * | 8/2000 | Shirley | 365/51 |

\* cited by examiner

*Primary Examiner*—Thomas Lee
*Assistant Examiner*—Tammara Peyton
(74) *Attorney, Agent, or Firm*—Anthony V.S. England; Robert M. Carwell

(57) ABSTRACT

For transmitting information on a plurality of integrated circuit conductive lines, n conductive lines are provided on a path in an integrated circuit. The path has first and second portions, and an interposing, transition portion. The lines have first positions with respect to one another in the first portion, and certain of the lines change relative positions in the transition portion, so that the lines have second positions with respect to one another in the second portion. The information is encoded in a format wherein no more than one of the n lines has a signal asserted thereon at a time, so that there is a reduction in noise induced among the lines.

24 Claims, 3 Drawing Sheets

METHOD AND APPARATUS FOR REDUCING NOISE INDUCED AMONG CONDUCTIVE LINES

TECHNICAL FIELD

This invention relates generally to electromagnetic coupling of conductors, and more specifically concerns noise induced among conductors used for transmitting information in the context of microelectronic circuitry.

BACKGROUND OF THE INVENTION

Electromagnetic coupling among conductors is an increasing concern for circuit designers. That is, in microelectronic circuitry, transistor dimensions and conductor spacing are both shrinking, while operating frequencies are increasing, which results in corresponding faster switching transition times (i.e., rise and fall times). These phenomena contribute to both increased electromagnetic coupling among lines and increased sensitivity to noise induced from active lines to quiet lines, which can result in unintentional switching of circuits. Therefore a need exists for reducing switching noise among conductors in integrated circuitry.

SUMMARY OF THE INVENTION

The foregoing need is addressed in the present invention, as follows.

For transmitting information on a plurality of integrated circuit conductive lines, n conductive lines are provided on a path in an integrated circuit. The path has first and second portions, and an interposing, transition portion, wherein the lines have first positions with respect to one another in the first portion, and certain of the lines change relative positions in the transition portion, so that the lines have second positions with respect to one another in the second portion. A driver is operatively coupled to the lines for transmitting information on the n lines. The information is encoded in a format wherein only one of the n lines has a signal asserted thereon at a time, so that there is a reduction in noise induced among the lines.

In another aspect, in the first path portion, certain lines are adjacent to one another, and the change in relative positions is such that none of the lines adjacent to one another in the first portion remain adjacent to one another in the second portion.

In a further aspect, the lines are positioned wherein for at least one of the first and second positions the lines are substantially in a single plane. Also, the lines may be positions such that in the first positions the lines are substantially in a single plane, and in the second positions the lines are also substantially in a single plane.

In a still further aspect, n=4, and a first two of the lines are interior with respect to the other two lines, according to the first positions, while the first two are exterior with respect to the other two lines according to the second positions.

In another aspect, the lines are ordered with respect to one another 0-1-2-3 according to the first position, and ordered with respect to one another 1-3-0-2 according to the second position. Alternatively the lines may be ordered with respect to one another 0-1-2-3 according to the first positions, and 2-0-3-1 according to the second positions.

In another embodiment, for transmitting information on a plurality of integrated circuit conductive lines, m sets of n conductive lines are provided on m respective paths in an integrated circuit. A number, x, of the m paths have first and second portions, and an interposing, transition portion. Such n lines of such x paths have first positions with respect to one another in the first portion, and second positions with respect to one another in the second portion. A number, m-x, of the m paths have first, second and third portions, a first interposing, transition portion between the first and second portions, and a second interposing, transition portion between the second and third portions. Such n lines of such x-m paths have first positions with respect to one another in the first portion, second positions with respect to one another in the second portion, and third positions with respect to one another in the third portion. At least one driver is operatively coupled to the lines for transmitting information on each set of n lines in a format wherein only one of the n lines has a signal asserted thereon at a time.

In another aspect, for the both the x paths and the m-x paths, in the first path portion, certain lines are adjacent to one another, but none of the lines adjacent to one another in the first portion remain adjacent to one another in the second portion.

In yet another aspect, for the m-x paths, in the second path portion, certain lines are adjacent to one another, but none of the lines adjacent to one another in the second portion remain adjacent to one another in the third portion. Also, the third positions may be the same as the first positions, or the third positions may be different than the first positions.

DETAILED DESCRIPTION OF THE PREFERRED EMBODIMENT

Figure 1:
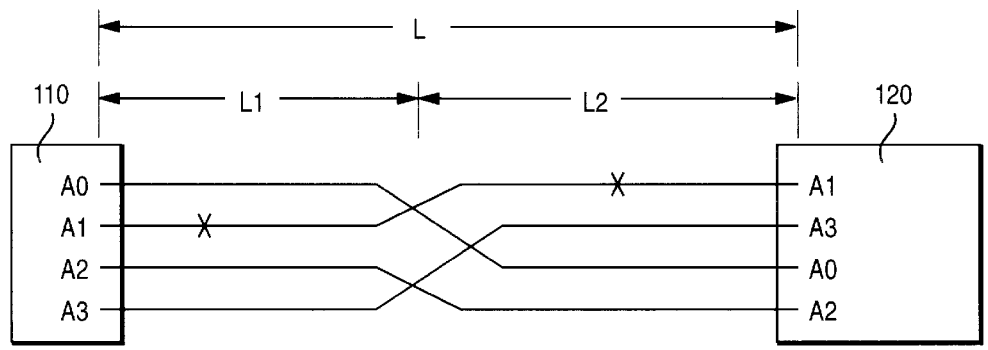
FIG. 1 shows physical layout aspects of an embodiment having a B2 encoded signal asserted on four conductors with a single crossover.

To reduce power consumption, logic circuitry may be based on a 2B encoding scheme, instead of a more conventional dual rail binary logic scheme. The comparison of the two schemes is illustrated in the following table:

| dual rail binary | | | | 2B encoded | | | |
|---|---|---|---|---|---|---|---|
| A | $\overline{A}$ | B | $\overline{B}$ | A0 | A1 | A2 | A3 |
| 0 | 1 | 0 | 1 | 1 | 0 | 0 | 0 |
| 0 | 1 | 1 | 0 | 0 | 1 | 0 | 0 |
| 1 | 0 | 0 | 1 | 0 | 0 | 1 | 0 |
| 1 | 0 | 1 | 0 | 0 | 0 | 0 | 1 |

(Note that the encoding may be referred to by some as "decoding," and 2B may be referred to by some as "B2.")

In the dual rail system, four logical states may be represented by two bits A and B. For each of the two bits A and B, the dual rail system also has two complimentary bits. Note that two of the four bits must be asserted for each of the four states illustrated in dual rail binary.

It is typical in dynamic logic that a line driver output is driven low during a precharge phase each clock cycle. Thus, for the dual rail logic scheme, at least two lines go through a signal transition from 0 to 1 during an evaluation phase each clock cycle. It is these signal transitions, wherein one line is driven to a different voltage than a neighboring line, which tend to induce noise in the neighboring lines.

The signals referred to herein are generally described in terms of digital signals which have two logic states, an active state and an inactive state. The signals are further described in terms of a signal in an active state having a higher voltage level than a signal in an inactive state. For example, in one embodiment, a signal is considered to be in an active state when the signal is at least 90% of Vdd, where Vdd is nominally 1.35 volts, and the signal is considered to be in the inactive state when the signal is no greater than 0.135 volts. The term "assert," as used herein, refers to the rendering of a logic signal or register bit into its active, i.e., logically true, state. Thus, when it is stated that only one of the lines has a signal asserted, in these terms, this refers to only one of the lines having a voltage impressed thereon of at least 1.215 volts, while the other lines are substantially at ground potential, that is having voltages impressed thereon no greater than 0.135 volts. It should be understood that in an "active low" implementation, the term "negate" may be used, for example, to refer rendering a signal or register bit into a state having the relatively higher voltage level.

Substituting the 2B encoded protocol shown in the above table for dual rail binary logic reduces the number of signals asserted from two signals to one during each evaluation. That is, for 2B encoding a signal is asserted on only one of the lines for each of the respective four states illustrated. This cuts the power consumption of the driver circuitry in half, as compared with dual rail, which is particularly useful if long lines are driven.

By reducing the number of signals asserted, 2B encoding also reduces induced noise. Nevertheless, the noise sensitivity of a receiving circuit may be such that coupled noise from a line running adjacent to its quiet input may cause the circuit to evaluate erroneously. This is especially problematic for dynamic circuits, where false switching of a receiving circuit causes a non-recoverable error to be broadcast.

To minimize this coupling and the erroneous switching caused by this coupling, a particular interleaving of lines, herein described, is combined with 2B encoding. The physical interleaving, according to one embodiment of the invention, is shown in FIG. 1.

For a first lengthwise portion L1 of a path L which the group of lines A0, A1, A2 and A3 follow, line A0 is on an edge of the group, and is thus adjacent only to line A1. For a second lengthwise portion L2 of the path, A0 is interior to the group, and is adjacent to both A3 and A2. Likewise, A1 is interior and is adjacent to A0 and A2 for the first lengthwise portion, but is on an edge and adjacent only to A3 for the second. Similarly, A2 and A3 also are each on an edge of the group for only one of the two portions. They correspondingly change neighbors for their respective interior portions of the path. Note that similar crossover patterns may be employed as long as same relative adjacency is achieved.

In general, for four lines in a single plane, such as A0 through A3, there are only three pairs of adjacent lines for any given configuration of the lines. For example, in FIG. 1, for the first lengthwise portion, L1, of the length L of the path, the lines are positioned with respect to one another A0–A1–A2–A3 in substantially a single plane, so that the adjacent pairs are A0–A1, A1–A2, and A2–A3. For the second lengthwise portion, L2, of the length L of the path, the lines are positioned with respect to one another A1–A3–A0–A2 in substantially a single plane, i.e., the lines are interleaved with one another in comparison to their first positions, so that in the second positions the adjacent pairs are A1–A3, A3–A0, and A0–A2 Thus, according to this configuration, the group runs for the certain length L, and any pair of the lines A0 through A3 are adjacent for only one of the two lengthwise portions of the path. That is, for example, A1 is adjacent to A0 and A2 in the first portion and only to A3 in the second.

In this FIG. 1, an encoder 110 is shown operatively coupled to the conductive lines. The 2B encoder 110 encodes information to be driven on the lines in a 2B format. The logic for such an encoder is known. See, for example, U.S. Pat. No. 5,668,525, Comparator Circuit Using Two-Bit to Four Bit Encoder; U.S. patent application Ser. No. 08/770, 220, Block Address Translation Circuit Using Two-Bit to Four-Bit Encoder; and U.S. patent application Ser. 08/772, 215, Register File Array Having a Two-Bit to Four-Bit Encoder; all of which are hereby incorporated herein by reference.

Also shown in FIG. 1, the lines are operatively coupled to a receiver 120. The receiver may be a comparator, as disclosed in one or more of the above cited and incorporated references, or may be a decoder for converting the information from the 2B format to another format, such as dual rail, such as would be apparent to one of ordinary skill in logic design, given the present disclosure.

In another aspect, according to the B2 logic encoding, as set out in table 1, a logical "true" signal is asserted on only one of the lines A0 through A3 at any one time. Thus, for any of the three pairs of adjacent lines, due to B2 encoding no more than two of the pairs are logically orthogonal. Further, due to the above described change in positions of the lines, for these two or fewer pairs of lines that are logically orthogonal, the lines of such a pair are adjacent for only one of the lengthwise portions of the path length. An "x" is shown only on line A1 to indicate, for example, a signal asserted only on this one of the four lines. In the L1 portion of the path, A1 is thus logically orthogonal to adjacent lines A0 and A2 That is, in L1 only pairs A1–A0 and A1–A2 are logically orthogonal and adjacent. In L2, only pair A1–A3 are logically orthogonal and adjacent. A rough measure of coupling may be quantified according to the following:

2 adjacent, orthogonal pairs * 0.5 L+1 adjacent, orthogonal pair * 0.5 L=1.5 adjacent, orthogonal pair-lengths.

Considering, as an ideal, that noise is only induced in a line only by a line that is adjacent and logically orthogonal, the above described combination of B2 encoding and inter-digitating reduces induced noise in comparison with dual rail logic and no physical interleaving. Consider the non-interleaved configuration of lines shown in FIG. 2, wherein the same logical information is transmitted on a dual rail logic basis, so that signals are asserted on lines B and not A. Using the same measure, the coupling for this arrangement is as follows:

3 adjacent, orthogonal pairs * L=3 adjacent, orthogonal pair-lengths.

Figure 2:
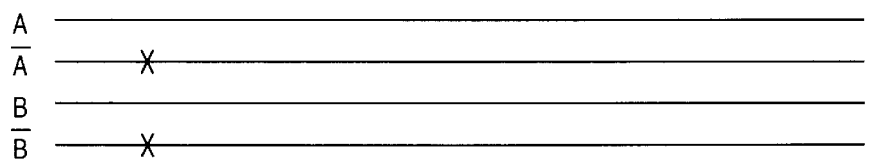
FIG. 2 shows a prior art physical layout of four conductors having no crossover and having a dual rail logic signal asserted.

The coupling, for this example, according to the embodiment illustrated by FIG. 1 is 50% less than that of FIG. 2, using the adjacent, orthogonal pair-length measure.

Figure 3:
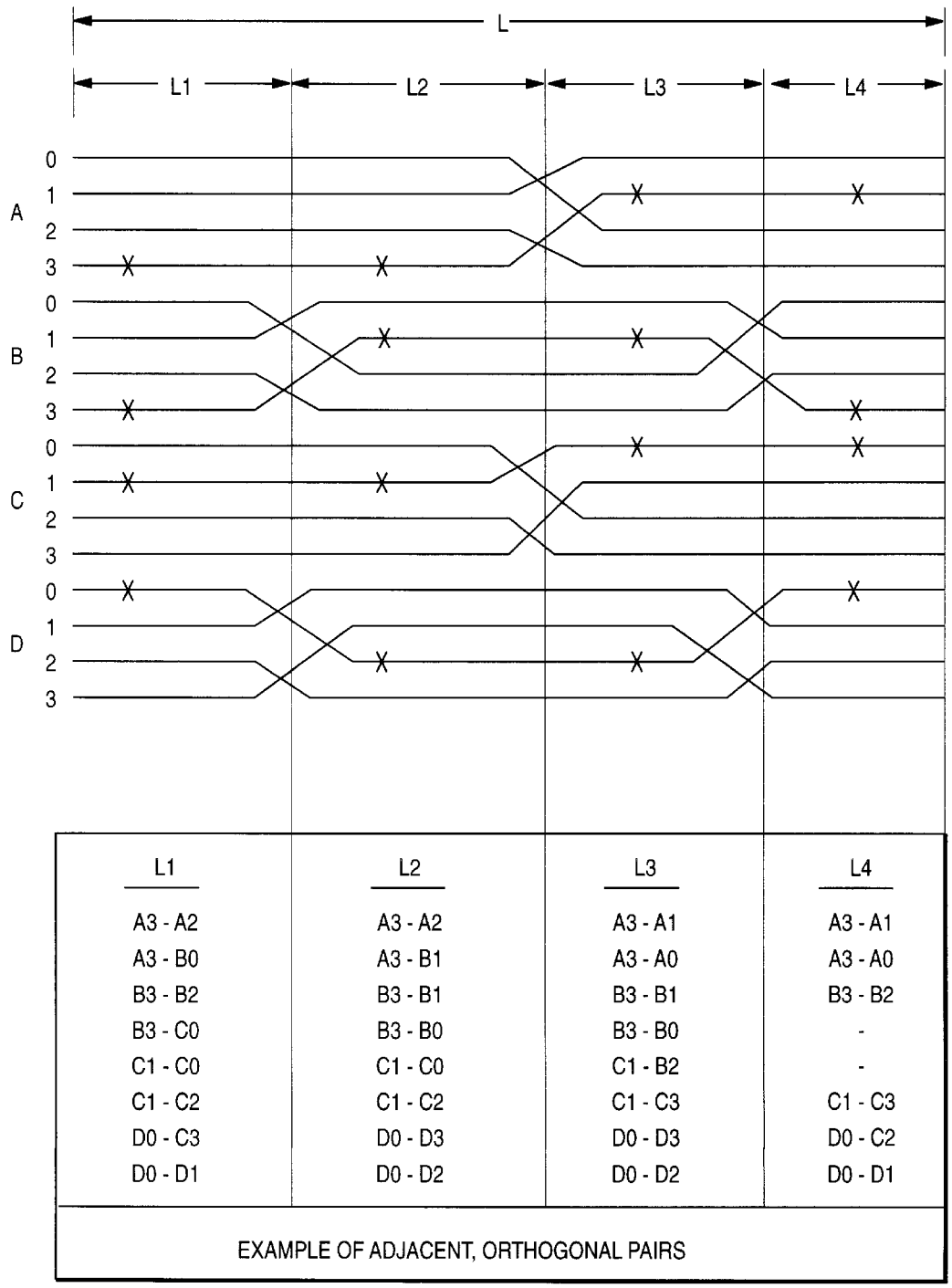
FIG. 3 shows physical layout aspects of an embodiment having four B2 encoded signals asserted on four respective groups of four conductors, some groups having one crossover, and other groups having two crossovers.

FIG. 3 shows an embodiment of the present invention for additional lines. The previously described electromagnetic coupling problem is most acute where substantial lengths of conductors are closely spaced. In a complex microprocessor chip, many buses must be connected to circuitry far away from the driving source. This usually implies that interconnection wires run in parallel for a great distance.

In FIG. 3, the crossovers points for lines A0–A3 and for lines C0–C3 are as depicted in FIG. 1, i.e., at the midpoint of the respective path at the L2–L3 interface. Thus, these two groups of lines each have a single transition portion between their first portion, i.e., the L1 and L2 parts of the path, and second portion, i.e., the L3 and L4 parts of the path. However, for bits B0–B3 and bits D0–D3 their crossover points are at the ¼ and ¾ points of the bus path length at the L1–L2 and L3–L4 interfaces. Thus, these two groups have a first transition portion between their first portion, i.e., L1 of the path, and second portion, i.e., L2 and L3 of the path, and have a second transition portion between their second portion and their third portion, i.e., L4. This variation of crossover point locations mitigates coupling due to a line on the edge of one group of lines, such as line A3 in the group of bits A0–A3, being orthogonal to an adjacent line on the edge of another group, such as line B0 in the group of lines B0–B3. In FIG. 3, lines A3, B3, C1, and D0 are indicated as having a signal asserted thereon.

Figure 4:
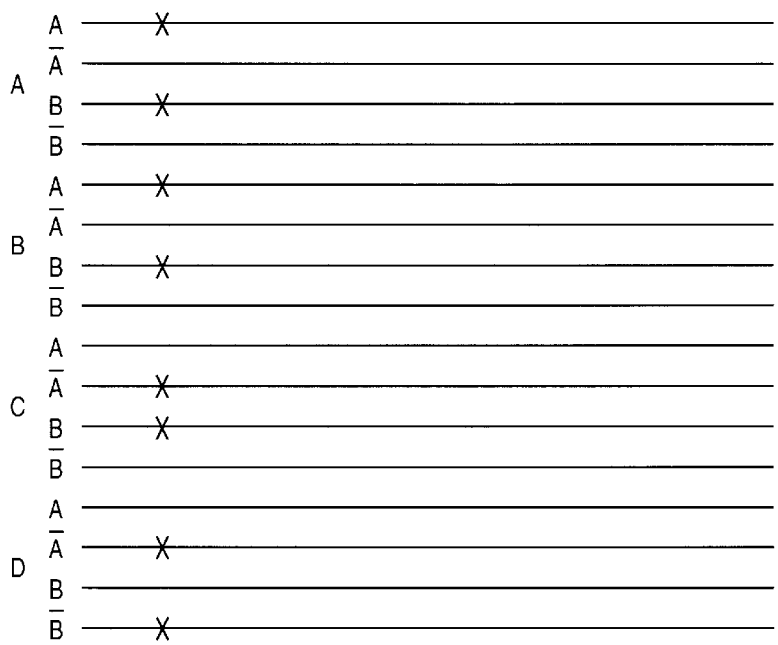
FIG. 4 shows a prior art physical layout having four dual rail logic signals asserted on four respective groups of four conductors, none of the groups having a crossover.

A table is included in FIG. 3 which tabulates the pairs of adjacent, orthogonal pairs for this example. Referring to the table, there are 8 adjacent, orthogonal pairs for each of lengthwise portions L1, L2 and L3, and only 6 for L4. The adjacent, orthogonal pair-lengths measure of coupling for this configuration is thus 8*0.25+8*0.25+8*0.25+6*0.25= 7.5. This is contrasted with the dual rail, non-interleaved implementation shown in FIG. 4, for which the adjacent, orthogonal pair-lengths measure is 12. Thus, for this example, the FIG. 3 embodiment reduces coupling by 37.5%, as measured according to adjacent, orthogonal pair-lengths.

The invention is extendible to buses having many lines, as is illustrated in FIG. 3. To make clear the pattern set out in FIG. 3, the pattern is described as follows. The pattern of crossovers shown in group A0–A3 is applied to a first set of four lines. The pattern shown in group B0–B3 is applied to a second set. Then the two patterns are alternately repeated for each additional set of 4 lines. That is, for the 16 lines of FIG. 3, the A0–A3 pattern, i.e., a single, midpoint crossover, is repeated for the third set of four lines, C0–C3; and the B0–B3 pattern, i.e., crossovers at the ¼ and ¾ points, is repeated for the fourth set of four lines.

Figure 5:
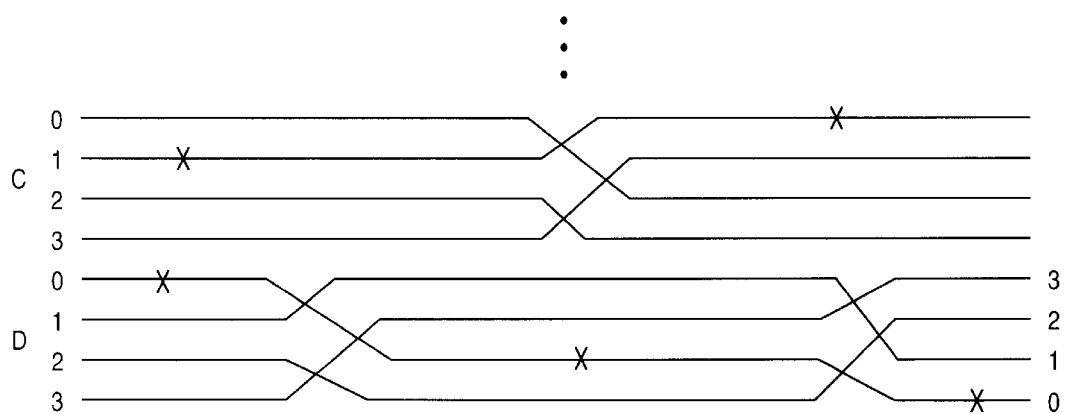
FIG. 5 shows a variation for one aspect of the embodiment shown in FIG. 3.

Another variation is shown in FIG. 5, wherein the third and fourth group of four lines from FIG. 3 are shown again, but with a change. For the group of lines D0–D3, in the third portion, i.e., the L4 portion of the path L, the lines have positions 3-2-1-0 from top to bottom, whereas they have positions 0-1-2-3 from top to bottom in the first portion. This further reduces the number of pairs of adjacent, orthogonal lines by 1 pair, in the example, and further reduces the induced noise accordingly.

While the invention has been shown and described with reference to particular embodiments thereof, it will be understood by those skilled in the art that the foregoing and other changes in form and detail may be made therein without departing from the spirit and scope of the invention. Furthermore, it should be understood that the invention is defined in the claims following, and is not limited to the embodiments described.

What is claimed is:

1. A method for transmitting encoded logical state information on a plurality of integrated circuit conductive lines, comprising the steps of:

encoding a selected one of four predetermined logical states to an encoded signal; and transmitting the encoded signal on four conductive lines, wherein the transmitting includes:
  impressing a first voltage level on no more than one selected conductive line at a time among the four conductive lines;
  impressing a second voltage level, at the same time, on the three conductive lines not having the first voltage impressed thereon; and
  transmitting the voltages in first positions with respect to one another along a first portion of the lines, and second positions with respect to one another along a second portion of the lines, so that there is a reduction in noise induced by voltage differences among the lines.

2. The method of claim 1, wherein the first positions include certain lines being adjacent to one another in the first portion of the lines, and the second positions include none of the lines adjacent to one another in the first positions being adjacent to one another in the second portion of the lines.

3. The method of claim 2, wherein the lines positioned according to at least one of the first and second positions are substantially in a single plane.

4. The method of claim 3, wherein the lines positioned according to the first positions are substantially in a single plane, and according to the second positions are also substantially in a single plane.

5. The method of claim 4, a first two of the lines being interior with respect to the other two lines according to the first position, and the first two being exterior with respect to the other two lines according to the second position.

6. The method of claim 5, the lines being ordered with respect to one another 0-1-2-3 according to the first position, and being ordered with respect to one another 1-3-0-2 according to the second position.

7. The method of claim 5, the lines being ordered with respect to one another 0-1-2-3 according to the first position, and being ordered with respect to one another 2-0-3-1 according to the second position.

8. A method for reducing induced noise in the transmitting of information on a plurality of integrated circuit conductive lines, comprising the steps of:

impressing a first voltage level on no more than one conductive line at a time among n conductive lines of a first set of n conductive lines;

impressing a second voltage level, at the same time, on all the n conductive lines of the first set not having the first voltage level impressed thereon;

transmitting the first and second voltages levels in first positions with respect to one another along a first portion of the lines in the first set, and second positions with respect to one another along a second portion of the lines in the first set;

impressing the first voltage level on no more than one conductive line at a time among n conductive lines of a second set of n conductive lines;

impressing the second voltage level, at the same time, on all of the n conductive lines of the second set not having the first voltage level impressed thereon; and transmitting the first and second voltage levels in first positions with respect to one another along a first portion of the lines in the second set, second positions with respect to one another along a second portion of the lines in the second set, and third positions with respect to one another along a third portion of the lines in the second set.

9. The method of claim 8, wherein, for both sets of n conductive lines, in the respective first portions, certain lines are adjacent to one another, and in the respective second portions none of the lines are adjacent to one another that are adjacent to one another in the respective first portions.

10. The method of claim 9, wherein, for the second set of n conductive lines, in the second portion, certain lines are adjacent to one another, and in the third portion none of the lines are adjacent to one another that are adjacent to one another in the second portion.

11. The method of claim 10, wherein the third positions are the same as the first positions.

12. The method of claim 11, wherein the third positions are different that the first positions.

13. A computer data signal, comprising:
   a first voltage level impressed on no more than one selected conductive line at any given time among four conductive lines;
   a second voltage level impressed, at said any given time, on the other three of the four lines, wherein the first voltage level impressed on the one selected line and the second voltage level impressed on the other three lines represents a selected one of four predetermined logical states according to an encoding of the four logical states, and wherein the first and second voltage levels are transmitted on the lines in first positions with respect to one another along a first portion of the lines, and second positions with respect to one another along a second portion of the lines, so that there is a reduction in noise induced by voltage differences among the lines.

14. The computer data signal of claim 13, wherein, in the first portion, certain of the lines are adjacent to one another, and wherein none of the lines adjacent to one another in the first portion remain adjacent to one another in the second portion.

15. The computer data signal of claim 14, wherein the lines positioned according to at least one of the first and second positions are substantially in a single plane.

16. The computer data signal of claim 15, wherein the lines positioned according to the first position are substantially in a single plane, and according to the second position are also substantially in a single plane.

17. The computer data signal of claim 16, a first two of the lines being interior with respect to the other two lines according to the first position, and the first two being exterior with respect to the other two lines according to the second position.

18. The computer data signal of claim 17, the lines being ordered with respect to one another 0-1-2-3 according to the first position, and being ordered with respect to one another 1-3-0-2 according to the second position.

19. The computer data signal of claim 17, the lines being ordered with respect to one another 0-1-2-3 according to the first position, and being ordered with respect to one another 2-0-3-1 according to the second position.

20. A plurality of computer data signals, comprising:
   first voltage level impressed on no more than one conductive line at a time among n conductive lines of a first set of n conductive lines;
   second voltage level impressed, at the same time, on all the n conductive lines of the first set not having the first voltage level impressed thereon, wherein the voltages are transmitted in first positions with respect to one another along a first portion of the lines in the first set, and second positions with respect to one another along a second portion of the lines in the first set;
   the first voltage level impressed on no more than one conductive line at a time among n conductive lines of a second set of n conductive lines; and
   the second voltage level impressed, at the same time, on all the n conductive lines of the second set not having the first voltage level impressed thereon, wherein the first and second voltage levels are transmitted in first positions with respect to one another along a first portion of the lines in the second set, second positions with respect to one another along a second portion of the lines in the second set, and third positions with respect to one another along a third portion of the lines in the second set.

21. The computer data signal of claim 20, wherein, for both sets of n conductive lines, in the respective first portions, certain lines are adjacent to one another, and in the respective second portions none of the lines are adjacent to one another that are adjacent to one another in the respective first portions.

22. The computer data signal of claim 21, wherein, for the second set of n conductive lines, in the second portion, certain lines are adjacent to one another, and in the third portion none of the lines are adjacent to one another that are adjacent to one another in the second portion.

23. The computer data signal of claim 22, wherein the third positions are the same as the first positions.

24. The computer data signal of claim 23, wherein the third positions are different than the first positions.

* * * * *